US012627170B2

(12) United States Patent
Hiemstra et al.

(10) Patent No.: US 12,627,170 B2
(45) Date of Patent: May 12, 2026

(54) INDUCTIVE COIL ASSEMBLIES FOR ELECTRONIC DEVICES AND ACCESSORIES

(71) Applicant: Apple Inc., Cupertino, CA (US)

(72) Inventors: Daniel J. Hiemstra, San Francisco, CA (US); Zaki Moustafa, San Francisco, CA (US); Zelin Xu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 818 days.

(21) Appl. No.: 17/952,106

(22) Filed: Sep. 23, 2022

(65) Prior Publication Data

US 2024/0106270 A1 Mar. 28, 2024

(51) Int. Cl.
*H02J 50/00* (2016.01)
*H02J 50/10* (2016.01)
*H05K 5/02* (2006.01)

(52) U.S. Cl.
CPC ........... *H02J 50/005* (2020.01); *H02J 50/10* (2016.02); *H05K 5/0256* (2013.01)

(58) Field of Classification Search
CPC ........ G04G 17/00; G04G 17/04; G04G 17/08; G04G 17/06; G04R 60/00; G04R 60/10; G06F 1/163; G06F 1/189
See application file for complete search history.

(56) References Cited

U.S. PATENT DOCUMENTS

| | | | | |
|---|---|---|---|---|
| 3,670,491 | A | | 6/1972 | Weschler |
| 5,889,737 | A | * | 3/1999 | Alameh ............... G04G 17/083 |
| | | | | 368/204 |

| | | | | |
|---|---|---|---|---|
| 6,350,055 | B1 | * | 2/2002 | Barras ................ G04B 37/1486 |
| | | | | 368/282 |
| 6,619,835 | B2 | * | 9/2003 | Kita ...................... A44C 5/0015 |
| | | | | 368/282 |
| 6,854,978 | B2 | * | 2/2005 | Noirjean ................ G04G 17/06 |
| | | | | 343/718 |
| 8,787,006 | B2 | * | 7/2014 | Golko ..................... G06F 3/017 |
| | | | | 455/575.6 |
| 9,166,334 | B1 | | 10/2015 | Huang et al. |

(Continued)

FOREIGN PATENT DOCUMENTS

| | | | | |
|---|---|---|---|---|
| CN | 108936994 | A | * 12/2018 | ............... A44C 5/14 |
| CN | 209016774 | U | 6/2019 | |

(Continued)

OTHER PUBLICATIONS

Machine translation of Sun, Wei-Peng; CN-108936994-A; Publication date Dec. 7, 2018.*

(Continued)

*Primary Examiner* — Jared Fureman
(74) *Attorney, Agent, or Firm* — Kilpatrick Townsend & Stockton LLP

(57) ABSTRACT

Inductive coil assemblies for wireless power transfer can be provided for an electronic device having a slot to receive an accessory and an accessory having an attachment region that is insertable into the slot. The inductive coil assembly of the device can extend along a sidewall of the slot. The inductive coil assembly of the accessory can extend along one side surface of the attachment region of the accessory. The opposite sidewall of the slot and side surface of the attachment region of the accessory can provide mechanical retention features.

17 Claims, 14 Drawing Sheets

(56) References Cited

U.S. PATENT DOCUMENTS

| | | | | |
|---|---|---|---|---|
| 9,581,972 | B1 * | 2/2017 | Arrow | G04G 21/00 |
| 9,665,068 | B2 * | 5/2017 | Lee | A44C 5/14 |
| 9,786,982 | B2 * | 10/2017 | Lee | H01Q 1/273 |
| 9,817,438 | B2 * | 11/2017 | VanDuyn | H04B 1/385 |
| 10,058,148 | B1 * | 8/2018 | Wittenberg | A44C 5/2057 |
| 10,058,149 | B1 * | 8/2018 | Wittenberg | G04G 17/06 |
| 10,298,075 | B2 | 5/2019 | Kallman et al. | |
| 10,448,711 | B2 | 10/2019 | Kallman et al. | |
| 10,691,072 | B1 * | 6/2020 | Johnson | G04G 9/0064 |
| 10,768,581 | B2 * | 9/2020 | Wang | G04G 17/04 |
| 11,177,691 | B2 * | 11/2021 | Henry | H01M 50/247 |
| 11,356,146 | B2 * | 6/2022 | Jia | H04B 5/79 |
| 11,442,503 | B2 * | 9/2022 | Hsu | H05K 1/028 |
| 11,803,162 | B2 * | 10/2023 | Pandya | G04G 17/04 |
| 2001/0031622 | A1 | 10/2001 | Kivela et al. | |
| 2003/0163287 | A1 | 8/2003 | Vock et al. | |
| 2011/0003665 | A1 | 1/2011 | Burton et al. | |
| 2011/0059769 | A1 | 3/2011 | Brunolli | |
| 2015/0227245 | A1 | 8/2015 | Inagaki et al. | |
| 2015/0311740 | A1 | 10/2015 | Hilario et al. | |
| 2016/0037878 | A1 | 2/2016 | Yabe et al. | |
| 2016/0091922 | A1 | 3/2016 | Nazzaro et al. | |
| 2018/0070840 | A1 * | 3/2018 | Cronin | A61B 5/7435 |
| 2020/0073337 | A1 * | 3/2020 | Wang | G06F 1/1656 |
| 2020/0326662 | A1 * | 10/2020 | Wang | G04G 17/08 |
| 2021/0050882 | A1 * | 2/2021 | Jia | H02J 7/02 |
| 2021/0399577 | A1 | 12/2021 | Qiu et al. | |

FOREIGN PATENT DOCUMENTS

| | | |
|---|---|---|
| JP | 2000078763 A | 3/2000 |
| KR | 20180055932 A | 5/2018 |
| KR | 20220023345 A | 3/2022 |

OTHER PUBLICATIONS

Notice of Allowance, KR Application No. 10-2023-0133463, dated Mar. 7, 2025, 3 pages.
British Patent Application No. GB2313367.1 , "First Examination Report", Nov. 28, 2024, 6 pages.
"Combined Search and Examination Report under Sections 17 and 18(3)," mailed Feb. 16, 2024 in Great Britian Application No. GB2313367.7. 8 pages.

* cited by examiner

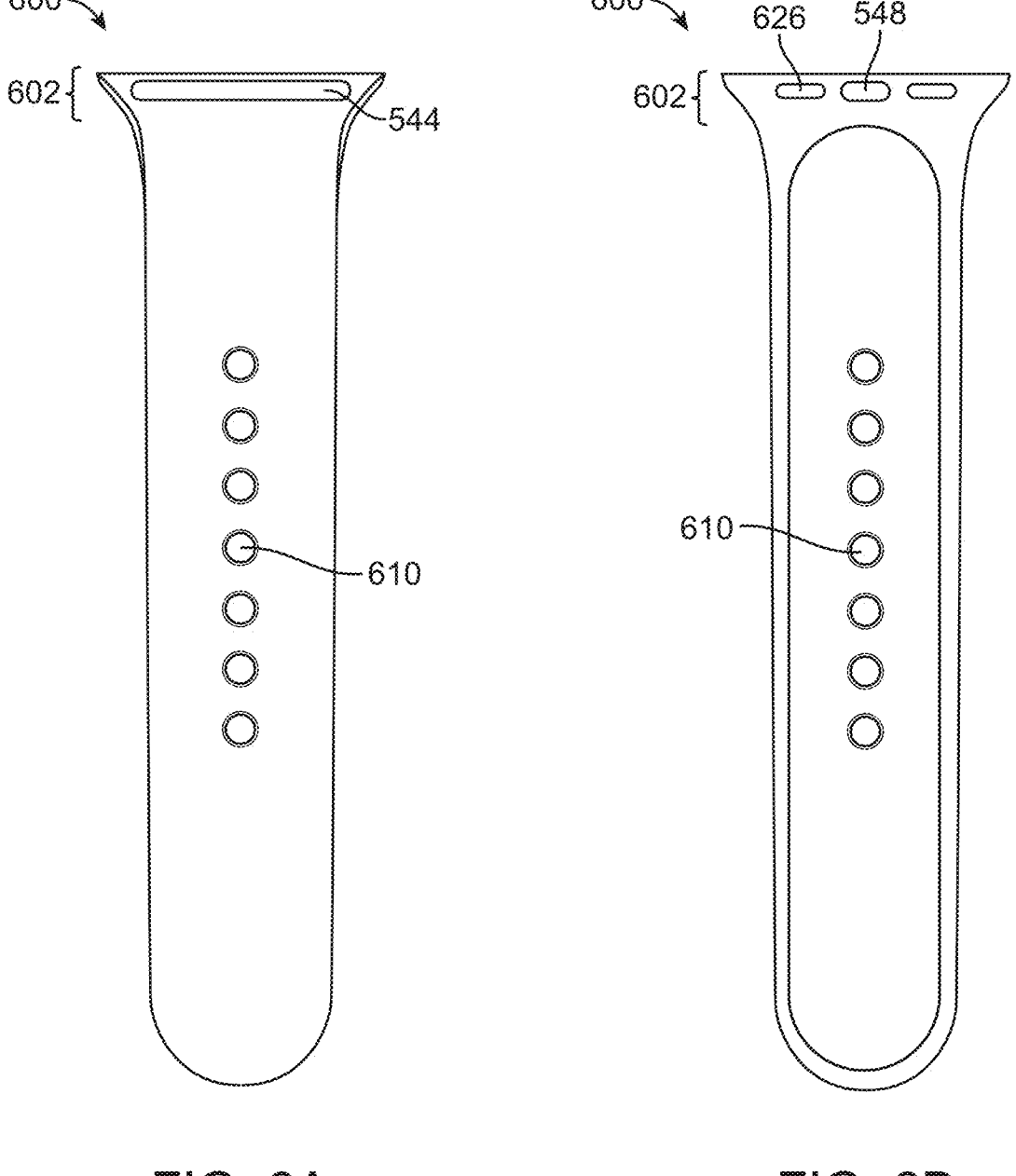
FIG. 6A                    FIG. 6B

700

| Fabricate housing having wall | 702 |

| Fabricate inductive coil assembly | 704 |

| Form cavity in end wall and glue port in front surface | 706 |

| Insert inductive coil assembly and plug into cavity | 708 |

| Inject glue via glue port and cure | 710 |

| Form band slot in end wall | 712 |

| Etch glue from glue port to expose electrical contacts of cap assembly | 714 |

| Connect electrical contacts to system board | 716 |

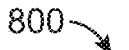
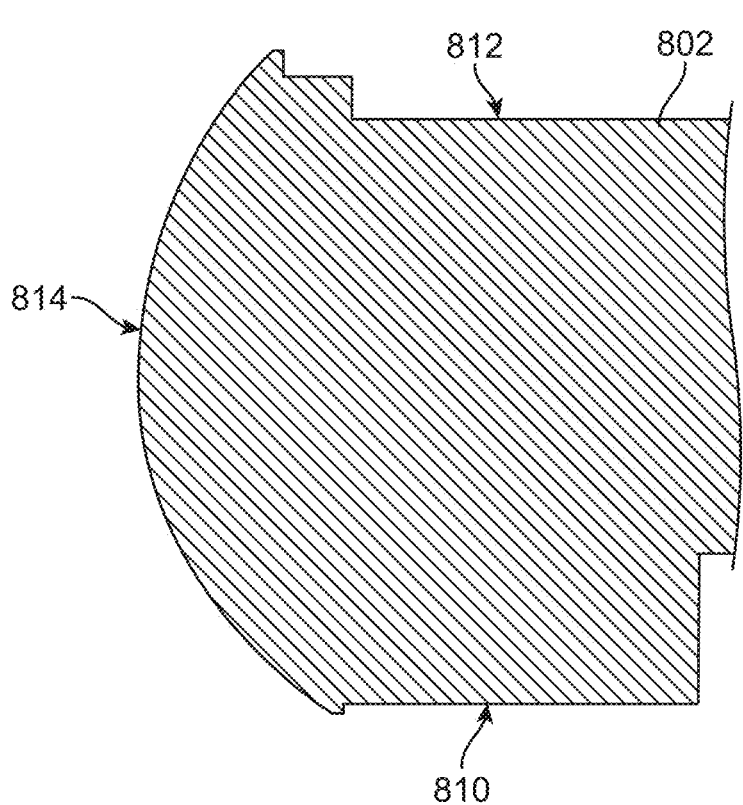
FIG. 8

INDUCTIVE COIL ASSEMBLIES FOR ELECTRONIC DEVICES AND ACCESSORIES

BACKGROUND

This disclosure relates to wearable electronic devices and in particular to inductive coil assemblies that enable power transfer between the main body of an electronic device and an attached band or other attachment member.

Wearable electronic devices, such as smart watches and fitness trackers, have become popular. Some devices can include a main body that incorporates electronic components, display, speakers, user input controls, and the like. The main body can be attached to a band, such as a wrist strap, that allows the device to be worn by a user. Depending on the particular implementation, wearable devices can provide various capabilities, such as communication (e.g., phone calls, text messages, email), biometric monitoring (e.g., heart rate, pulse oximetry), navigation (e.g., using global positioning satellite system signals), media playback, and so on.

In some wearable devices, the band (or other attachment member) may be detachably coupled to the main body. For example, the end walls of the main body may have slots that allow a band to be attached or detached by lateral sliding. To secure the band in the slot, the band can include a retention feature such as compressible tooth that is biased proud, and the main body can include a release button having a rest position that creates a recess in a sidewall of the slot. When the band is in position in the slot, the tooth extends into the recess to secure the band. The user can press the release button to push the tooth out of the recess and enable sliding. In this manner, the user can wear the same device with different bands at different times.

SUMMARY

To extend or enhance the functionality of an electronic device, it may be desirable to provide active electronic components in an accessory that can be attached to the electronic device. Such components may consume or produce power, and it may be desirable to transfer power between an accessory and an electronic device.

In some cases, however, the interface area between the accessory and the electronic device may be limited. For example, the accessory may be insertable into a slot in the body of the electronic device, and the interface area may be limited to the area of the slot. The small area may limit or prohibit the use of electrical contacts such as pads or pins made of conductive material. In addition, it may be desirable for any electrical connections to be water-resistant in order to avoid damage or malfunction in the event that the device and/or accessory is exposed to moisture (e.g., perspiration or immersion in water).

Inductive power transfer, in which power is transferred between respective wire coils (referred to as "inductive coils") in the two devices using electromagnetic induction, does not require any exposed electrical contacts. However, the amount of power that can be transferred inductively can be limited by, among other factors, the size of the coils and the distance between the coils. In the case of an accessory secured in a slot of a device, the interface area is defined by the slot dimensions. A portion of the interface area may be dedicated to mechanical retention features that secure the accessory to the device (such as a tooth and button). Accordingly, the space available for inductive charging coils in the device and accessory may be limited.

Certain embodiments of the present invention provide inductive coil assemblies and arrangements that can provide wireless power transfer between a device having a slot to receive an accessory and an accessory having an attachment portion that is insertable into the slot. In some embodiments, an inductive coil assembly in a main device body (such as a watch body) can extend along a sidewall of a slot into which an accessory (such as a band) is insertable. The accessory can have an attachment region (e.g., a region at an end of a band) that inserts into the slot (e.g., by lateral sliding). An inductive coil assembly can extend along one side surface of the attachment region of the accessory. When the accessory is attached to the main device body by inserting the attachment portion into the slot, the two inductive coil assemblies are brought into close proximity, allowing power transfer to occur. The opposite sidewall of the slot and the opposite side surface of the attachment region of the accessory can provide retention features (such as a recess and tooth) to provide mechanical retention.

Some embodiments relate to an electronic device. In various embodiments, an electronic device can have a housing having a wall, the wall having a slot formed therein to receive at least a portion of an accessory, the slot having first and second opposing sidewalls that extend along a lateral direction. An inductive coil assembly can be positioned in a recess in the first sidewall. An active electronic component disposed within the housing and coupled to the inductive coil assembly. An accessory retention feature can be disposed in the second sidewall of the slot.

Some embodiments relate to an accessory for use with an electronic device. In various embodiments, an accessory can include a body having an attachment region insertable into a slot of an electronic device. The attachment region can have a first side surface and a second side surface opposite the first side surface. An inductive coil assembly can be positioned in the attachment region and oriented toward the first side surface. A retention feature can be positioned in the attachment region and oriented toward the second side surface. An active electronic component can be disposed within the body and coupled to the inductive charging coil assembly.

In various embodiments, the respective accessory retention features of the electronic device and accessory can enable the accessory to be secured in the slot. For instance, the accessory retention feature of the electronic device can be or include a release button that extends from the second sidewall to a rear surface of the housing, where the release button provides a recess in the second sidewall when in a neutral position. The retention feature of the accessory can be or include a tooth that is biased proud to fit into the recess provided by the release button and compressible into the body of the accessory when the release button is pressed.

In various embodiments, the inductive coil assemblies of the electronic device and/or the accessory can include a ferrite core and a wire wrapped helically around at least a portion of the ferrite core. For example, the ferrite core can be shaped as a bar that extends along the lateral direction of the slot (or the attachment region), and the wire can be wrapped around a central portion of the bar. Exposed end portions of the ferrite core can be shaped to direct magnetic flux toward the sidewall of the slot (or the side surface of the attachment region). As another example, the ferrite core can have a U-shape with a elongate body that extends along the slot (or the attachment region) and legs that extend toward the sidewall of the slot (or the side surface of the attachment region), and the wire can be wrapped around the legs and/or the elongate body. The ferrite core can extend along the full lateral dimension of the slot, or it can be shorter if desired (e.g., half, or a third, or any other fraction of the lateral dimension of the slot). A magnetically permeable cap can be disposed over the inductive coil. In an electronic device having a slot, the magnetically permeable cap can form a portion of the first sidewall. In an accessory having an attachment region, the magnetically permeable cap can form a portion of the first side surface of the attachment region. The inductive coil assemblies can be operable to transfer power and/or data between the electronic device and the accessory, in either direction or in both directions at different times.

In various embodiments, the electronic device can be a wearable device, and the accessory can be a band usable to secure the electronic device to a part of the user's body, such as a wrist.

Some embodiments relate to methods of manufacturing an electronic device. In various embodiments, a method can include: providing a housing blank having a wall region that extends between a front surface and a rear surface of the housing blank; fabricating an inductive coil assembly that includes an inductive charging coil inserted into a cap blank made of a magnetically permeable material; forming a cavity in the wall region of the housing blank, the cavity extending inward from an open end at the rear surface of the housing blank; forming a glue port through the front surface of the housing blank, wherein the glue port connects to the cavity at an angle; inserting the inductive coil assembly into the cavity; injecting an adhesive (also referred to herein as "glue") through the glue port; and after the adhesive is cured, forming a slot in the wall region and through the cap blank, the slot having a first sidewall and a second sidewall opposite the first sidewall, wherein the slot is formed such that a portion of material of the cap blank forms a portion of the first sidewall.

In various embodiments, the glue port can be formed such that the glue port aligns with an electrical contact of the inductive coil assembly when the inductive coil assembly is inserted into the cavity, the electrical contact of the inductive coil assembly being coupled to the inductive charging coil. After the adhesive is cured, adhesive material can be removed from the glue port to expose the electrical contact. A cavity can be formed in the housing blank to receive a main logic board, and the main logic board can be electrically connected to the exposed electrical contact.

In various embodiments, the method can also include, prior to injecting the adhesive, inserting a plug into the cavity such that the plug fills a space between a rear end of the cap blank and the open end of the cavity. The slot can be formed such that the plug forms a portion of the second sidewall of the slot. The plug can be made of the same material as the housing wall region in which the slot is formed, of the same material as the cap blank, or of a different material.

The following detailed description, together with the accompanying drawings, will provide a better understanding of the nature and advantages of the claimed invention.

BRIEF DESCRIPTION OF THE DRAWINGS

FIGS. 6A and 6B show simplified front and rear views, respectively, of a band according to some embodiments.

FIGS. 8-16 illustrate various steps in the process of FIG. 7 according to some embodiments.

DETAILED DESCRIPTION

Figure 1:
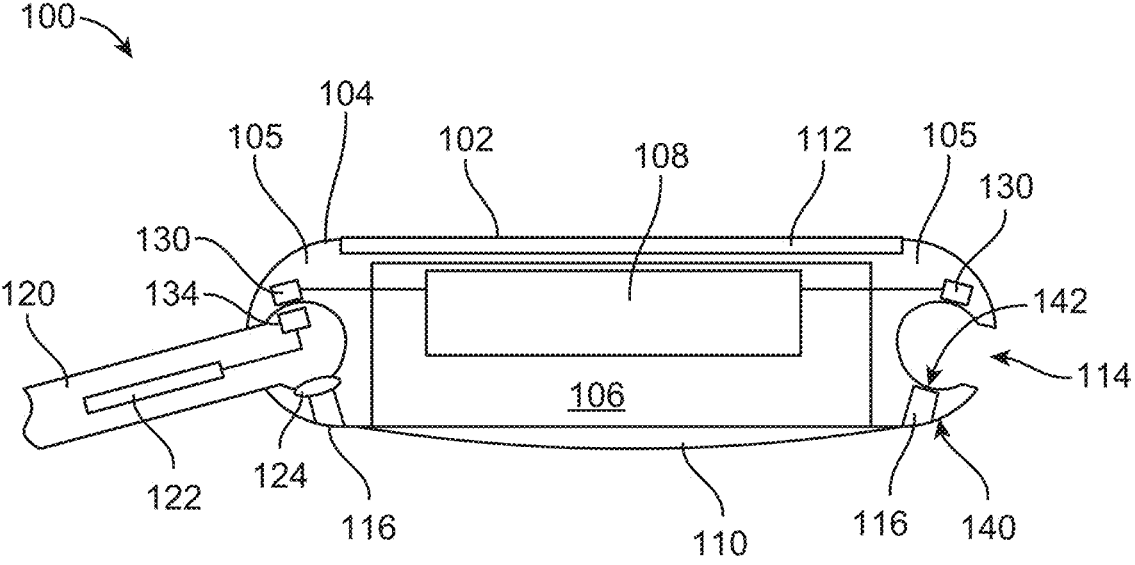
FIG. 1 shows a simplified cross-section view of a wearable electronic device according to some embodiments.

The following description of exemplary embodiments of the invention is presented for the purpose of illustration and description. It is not intended to be exhaustive or to limit the claimed invention to the precise form described, and persons skilled in the art will appreciate that many modifications and variations are possible. The embodiments have been chosen and described in order to best explain the principles of the invention and its practical applications to thereby enable others skilled in the art to best make and use the invention in various embodiments and with various modifications as are suited to the particular use contemplated.

To extend or enhance the functionality of an electronic device, it may be desirable to provide active electronic components in an accessory that can be attached to the electronic device. For example, where the electronic device is a smart watch, the accessory can be a band that includes additional sensors, antennas, logic circuitry, cameras, microphones, or the like. Such components require power, and space for a battery may be limited. Therefore, it may be desirable for the accessory to receive power from the electronic device. Conversely, the accessory can include a power source, such as a battery or photovoltaic cell, and it may be desirable for the accessory to provide power from its power source to the electronic device (e.g., to extend the battery life of an internal battery of the device). These examples illustrate that it can be desirable to transfer power between an accessory and an electronic device.

In some cases, however, the interface area between the accessory and the electronic device may be limited. For example, where the electronic device is a smart watch and the accessory is a band having an attachment region at the end that is inserted into a slot (also called a "band slot") in the body of the smart watch, the interface area is limited to the area of the band slot. The small area may limit or prohibit the use of electrical contacts such as pads or pins made of conductive material. In addition, it may be desirable for any electrical connections to be water-resistant in order to avoid damage or malfunction in the event that the device and/or accessory is exposed to moisture (e.g., perspiration or immersion in water).

Inductive power transfer in which power is transferred between respective wire coils (referred to as "inductive coils") in the two devices using electromagnetic induction, does not require any exposed electrical contacts. However, the amount of power that can be transferred inductively can be limited by, among other factors, the size of the coils and the distance between the coils. In the case of an accessory secured in a slot of a device, the interface area is defined by the slot dimensions. A portion of the interface area may be dedicated to mechanical retention features that secure the accessory to the device (such as a tooth and button). Accordingly, the space available for inductive charging coils in the device and accessory may be limited.

Certain embodiments of the present invention provide inductive coil assemblies and arrangements that can provide wireless power transfer between a device having a slot to receive an accessory and an accessory having an attachment portion that is insertable into the slot. In some embodiments, an inductive coil assembly in a main device body (such as a watch body) can extend along a lateral surface of a slot into which an accessory (such as a band) is inserted. The accessory can have an attachment region (e.g., a region at an end of a band) that inserts into the slot (e.g., by lateral sliding). Within the attachment region, an inductive coil assembly can extend along one lateral surface of the attachment portion of the accessory. When the accessory is attached to the main device body, the two coil assemblies are brought into close proximity, allowing power transfer to occur. The opposite lateral surfaces of the slot and the band can provide retention features (such as a recess and tooth) to provide mechanical retention.

Examples, or embodiments, of arrangements of inductive coil assemblies for an electronic device and an accessory that is insertable by lateral sliding into a slot in the body of the electronic device will now be described, followed by description of a method for fabricating a device having an appropriately positioned inductive coil assembly. In these embodiments, the electronic device is a wearable electronic device (more specifically, a watch) and the accessory is a band to secure the watch to the user's wrist. Those skilled in the art with access to this disclosure will appreciate that the described embodiments are illustrative and that the same techniques can be applied in other instances where it is desirable to provide inductive power transfer between a first electronic device and a second electronic device that is insertable into a slot of the first electronic device.

FIG. 1 shows a simplified cross-section view of a wearable electronic system 100 according to some embodiments. In this example, wearable electronic system 100 is a wrist-worn system having a main device (also referred to as a main body) 102 and a band 120 that can be attached to or removed from main device 102. For purpose of illustration, one end of band 120 is shown in an attached configuration while the other end of band 120 is not shown. More generally, an accessory can attach to a device at one or more locations, and that inductive power transfer between the device and the accessory can be provided at any or all such locations.

Main device 102 can have a housing 104 that provides a main recess 106. Main recess 106 can incorporate a main logic module 108, which can include a microprocessor, battery, and other active system components for main device 102. Main logic module 108 can include any combination of components that can be made to fit within main recess 106, and such components can implement any functionality without departing from the spirit and scope of this disclosure. Additional components such as sensors, antennas, or other components may also be inserted into main recess 106 and coupled to main logic module 108. An electronic display 112 (which can be, e.g., a touchscreen display) can be positioned on a front surface of housing 104, and a rear housing member 110 can be positioned on a rear surface of housing 104. In some embodiments, rear housing member 110 can be attached and sealed to housing 104 after insertion of main logic module 108.

Housing 104 can include end walls 105. Each end wall 105 can be a region of housing material and can have a band slot 114 formed therein. In some embodiments, band slot 114 can be an elongated recess with opposing sidewalls that extends in a lateral direction along housing 104 (the lateral direction is into and out of the plane of FIG. 1). The sidewalls can be curved or straight as desired. In this example, the sidewalls have curvature and the slot has a C-shaped cross-section that can restrict longitudinal movement of a band in the slot (the longitudinal direction is left-right in the orientation of FIG. 1) In the example shown, two end walls 105 are located at opposing ends of housing 104; however, an end wall can be any portion of a device housing that has a slot formed therein to receive an accessory. In addition, while the term "band slot" is used herein, it should be understood that techniques described herein can be applied to any slot that receives an accessory, and an accessory need not have any particular form factor.

Band 120 can be an elongated structure (an end portion of which is shown) made using a flexible material or materials (e.g., fabrics, flexible plastics, leather, chains or flexibly interleaved plates or links made of metal or other rigid materials). In some embodiments, portions of band 120 can be made of a rigid material with hinges or other flexible features to facilitate donning and removal of wearable electronic system 100. Different portions of band 120 can be made of different materials; for instance, flexible or expandable sections can alternate with rigid sections. In some embodiments, band 120 can include two separate strap sections, each of which can have an attachment region at one end that is insertable into one of slots 114; the opposite ends of the straps sections can have complementary clasp features that can be engaged with each other to form a closed loop or other features to secure wearable electronic system 100 to the user's wrist. Alternatively, band 120 can be formed as a continuous band of an elastic material (including, e.g., elastic fabrics, elastic silicone, expandable metal links, or a combination of elastic and inelastic sections) with an attachment region at each end, and in some embodiments wearable electronic system 100 can be donned and removed by stretching band 120. A wide variety of band designs can be used.

Band 120 can be an "active" band that incorporates active circuitry 122. Circuitry 122 can include microprocessors, microcontrollers, sensors, antennas, data communication circuitry, power storage devices (e.g., batteries), power generation devices (e.g., photovoltaics), or any other circuitry compatible with the form factor of band 120, and can implement any desired functionality. In some embodiments, some or all of circuitry 122 can be implemented using flexible and/or low-profile electronic components. Various components or portions of circuitry 122 can be enclosed within the outer material of band 120 and/or exposed at a surface of band 120. The choice of circuitry 122 depends on the particular functionality desired for band 120.

Band 120 can be attached to and removed from main device 102 by sliding band 120 laterally along band slot 114. Band slot 114 and band 120 can include retention features and release mechanisms to prevent unwanted lateral sliding of band 120 while allowing wanted lateral sliding. For instance, band slot 114 can include a band release button 116 that extends through end wall 105 from the rear surface 140 to the sidewall 142 of band slot 114. Release button 116 can have a neutral position in which its outer surface is approximately flush with rear surface 140 and the inner surface is recessed from the surface of sidewall 142. Release button 116 can be pressed inward so that the inner surface becomes flush with sidewall 142 and can be biased by a spring force so that release button 116 returns to neutral position when pressure is released. Band 120 can have a corresponding retention feature, such as a retention tooth 124 that is biased proud. When band 120 is inserted into band slot 114 and band release button 116 is in its neutral position, retention tooth 124 that engages with the cavity in sidewall 142 formed when band release button 116 is in its neutral position. In this manner, unwanted lateral sliding of band 120 in band slot 114 while wearable electronic system 100 is being worn can be prevented. A user can remove band 120 by pressing band release button 116 inward while exerting lateral pressure on band 120. Other combinations of retention features and release mechanisms can also be used.

According to some embodiments, main device 102 and band 120 can include inductive power transfer components to allow power to be supplied from main logic module 108 in main device 102 to circuitry 122 in band 120 (or vice versa). For instance, main device 102 can include an inductive coil assembly 130 disposed along the length of band slot 114, and band 120 can include a corresponding inductive coil assembly 134. In main device 102, inductive coil assembly 130 can be disposed along a side surface of band slot 114 opposite band release button 116. In band 120, inductive coil assembly 134 can be disposed toward one side surface of the band attachment region while retention tooth 124 is arranged toward the opposite side surface. More generally, in an electronic device, an inductive coil assembly and a retention feature can be disposed along opposing sidewalls of a slot, and in an accessory, an inductive coil and a retention feature can be disposed along opposing side surfaces of an attachment region that is insertable into the slot.

When band 120 is inserted into band slot 114, inductive coil assembly 130 and inductive coil assembly 134 are brought into proximity, allowing power transfer to occur between respective coils in inductive coil assemblies 130 and 134. For instance, main logic module 108 can include control circuitry to drive current through a coil of inductive coil assembly 130, and band circuitry 122 can include circuitry to direct current induced in a coil of inductive coil assembly 134 to an internal power module (e.g., a battery or power supply). In addition or instead, power can be transferred in the reverse direction: band circuitry 122 can include control circuitry to drive current through a coil of inductive coil assembly 134, and main logic module 108 can include circuitry to direct current induced in a coil of inductive coil assembly 130 to an internal power module (e.g., a battery or power supply). In some embodiments, main logic module 108 can be configured to support bidirectional power transfer, transmitting or receiving power at different times depending on the particular connected band.

As suggested in FIG. 1, the inductive coils in a device and an accessory can have an shape corresponding to the geometry of the slot and attachment region. In some embodiments, inductive coil assemblies 130 and 134 can include elongated structures, referred to herein as "inductive bars," that include a wire coil wrapped around a core made of ferrite or other material capable of directing magnetic flux.

Figure 2:
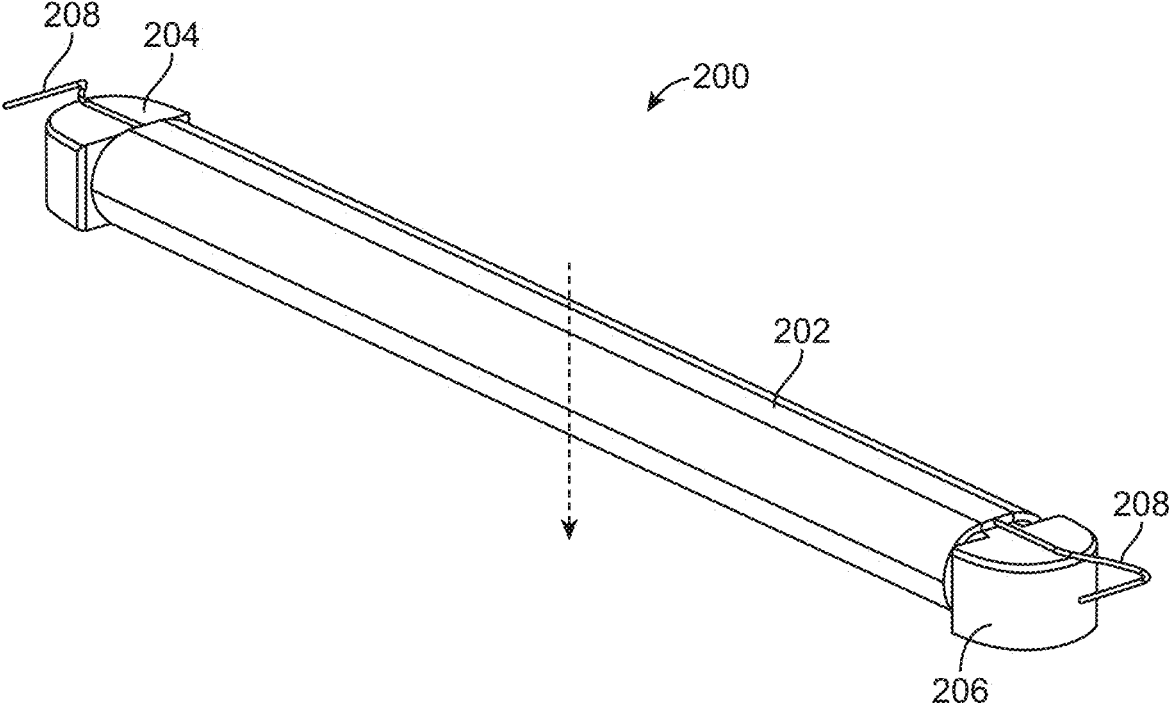
FIG. 2 shows a simplified perspective view of an inductive bar according to some embodiments.

FIG. 2 shows a simplified perspective view of an inductive bar 200 according to some embodiments. Inductive bar 200 can be used in inductive coil assembly 130 and/or inductive coil assembly 134 of FIG. 1. Inductive bar 200 can have an elongated shape and can include a ferrite core 204. Ferrite core 204 can be made of a soft ferrite or other material capable of directing magnetic flux. Ferrite core 204 can be an elongate structure having a circular, elliptical, oval, rectangular, or rounded-rectangular cross section (or other cross-section). Ferrite core 204 can have end caps 206, which can be made of the same material and optionally formed integrally with ferrite core 204. A coil 202 can be formed of conductive wire wrapped helically around ferrite core 204. Coil 202 can be made of single-stranded or multi-stranded wire as desired and can be wrapped in one or more layers around ferrite core 204. Insulating sheathing can be provided or omitted as desired. Wire ends 208, 210 of coil 202 are shown extending across end caps 206 of ferrite core 204.

For wireless power transfer, two instances of inductive bar 200 (a transmitter and a receiver) can be arranged adjacent to each other, e.g., with the flat surfaces of end caps 206 oriented toward each other. Magnetically permeable materials can be interposed between the two instances. An alternating current (or other time-varying current) can be applied to coil 202 in the transmitter instance of inductive bar 200. The alternating current can generate a time-varying magnetic field along the length of inductive bar 200, and end caps 206 can direct flux toward the receiver instance of inductive bar 200. Time-varying magnetic flux in the ferrite core 204 of the receiver instance of inductive bar 200 can induce alternating current in the coil 202 of the receiver, thereby transferring power.

The dimensions of inductive bar 200 can be chosen such that inductive bar 200 fits within an available space, such as a space within end wall 105 of housing 104 of main device 102 or a portion of the attachment end of band 120 as shown in FIG. 1. In some embodiments, inductive bar 200 can be shorter than the length of the band slot (e.g., half or one-third the length, or any other fraction).

Figure 3:
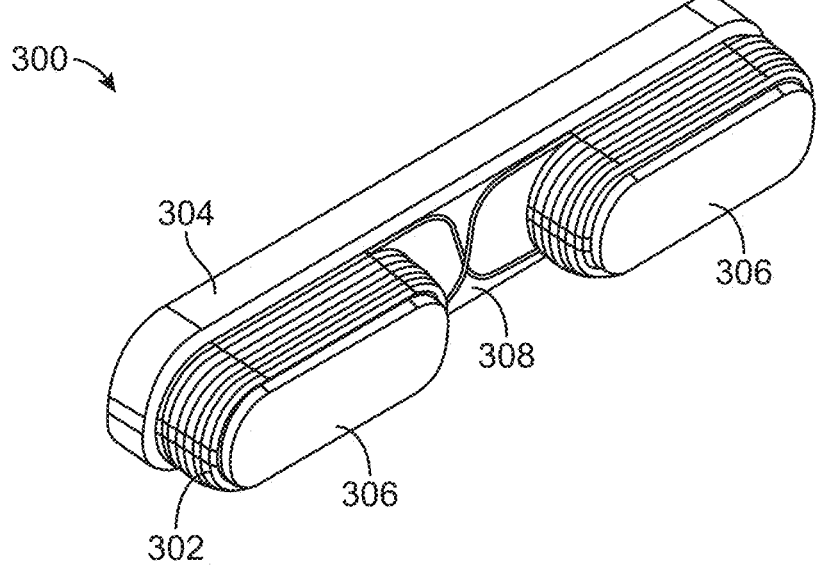
FIG. 3 shows a simplified perspective view of another inductive coil structure according to some embodiments.

In some embodiments, other inductive coil arrangements can be used instead of inductive bars. FIG. 3 shows a simplified perspective view of another inductive coil structure 300 according to some embodiments. Inductive coil structure 300 can be used in inductive coil assembly 130 and/or inductive coil assembly 134 of FIG. 1. Inductive coil structure 300 can include a ferrite core 304 having a U-shape with legs 306 extending from a body portion 308. Body portion 308 can be an elongated structure that extends along the lateral direction of a band slot (or attachment region when inductive coil structure 300 is implemented in an accessory such as a band). Ferrite core 304 can be made of a soft ferrite or other material capable of directing magnetic flux. Ferrite core 304 can be an elongate structure with legs 306 protruding therefrom. In some embodiments, legs 306 can be symmetrical with each other and can have a circular, elliptical, oval, rectangular, or rounded-rectangular cross section (or other cross-section). A coil 302 can be formed of conductive wire wrapped helically around legs 306. Coil 302 can be made of single-stranded or multi-stranded wire as desired and can be wrapped in one or more layers around legs 306. Coil 302 can be a single coil that is wrapped around both legs 306 in a manner such that the magnetic flux produced by a time-varying current passing through coil 302 has opposite directions in the two legs 306; that is, flux is created in a U-shape through ferrite core 304. Alternatively, two separate coils 302 can be used, one for each leg 306, with driver circuitry to coordinate the currents between the coils. Insulating sheathing can be provided or omitted as desired. Although not shown, wire ends of coil 302 can extend across the ends of body portion 308 to facilitate electrical connections of the kind described below.

For wireless power transfer, two instances of inductive coil structure 300 (a transmitter and a receiver) can be arranged adjacent to each other, e.g., with the exposed ends of legs 306 oriented toward each other. Magnetically permeable materials can be interposed between the two instances. An alternating current (or other time-varying current) can be applied to coil 302 in the transmitter instance of inductive coil structure 300. The alternating current can generate a time-varying magnetic field in a U shape that travels up through one leg 306, laterally along body portion 308 and down through the other leg 306. Legs 306 can direct flux toward the receiver instance of inductive bar 200, forming a closed-loop. Time-varying magnetic flux in the ferrite core 304 of the receiver instance of inductive coil structure 300 can induce alternating current in the coil 302 of the receiver, thereby transferring power.

The dimensions of inductive coil structure 300 or can be chosen such that inductive coil structure 300 fits within an available space, such as a space within end wall 105 of housing 104 of main device 102 or a portion of the attachment end of band 120 as shown in FIG. 1. In some embodiments, inductive coil structure 300 can be shorter than the length of the band slot (e.g., half or one-third the length, or any other fraction). Coils may be wrapped around either or both legs, and/or around the body portion of the ferrite core as desired. While the following description makes reference to inductive bars for purposes of illustration, it should be understood that inductive coil structure 300 or other inductive coil structures can be substituted, subject only to design constraints (including available space in a particular device or accessory).

Figure 4:
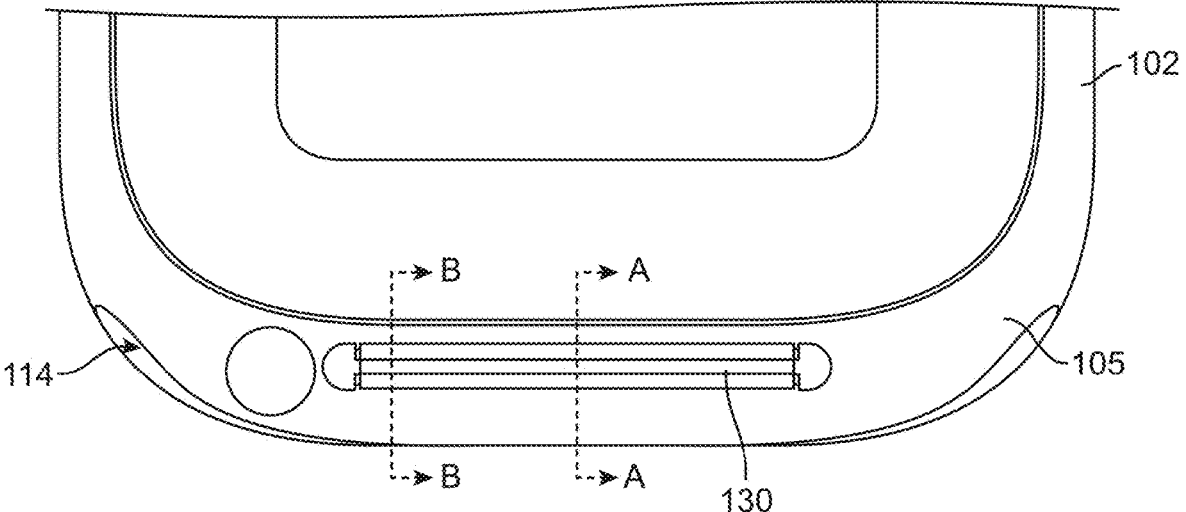
FIG. 4 shows a simplified partially transparent front view of a portion of a main body of an electronic device according to some embodiments.

FIG. 4 shows a simplified partially transparent front view of a portion of main device 102 including end wall 105 according to some embodiments. Band slot 114 extends laterally along end wall 105, and inductive coil assembly 130 extends laterally along band slot 114. In some embodiments, the length of inductive coil assembly 130 is limited only by the length of band slot 114.

Figures 5A, 5B:
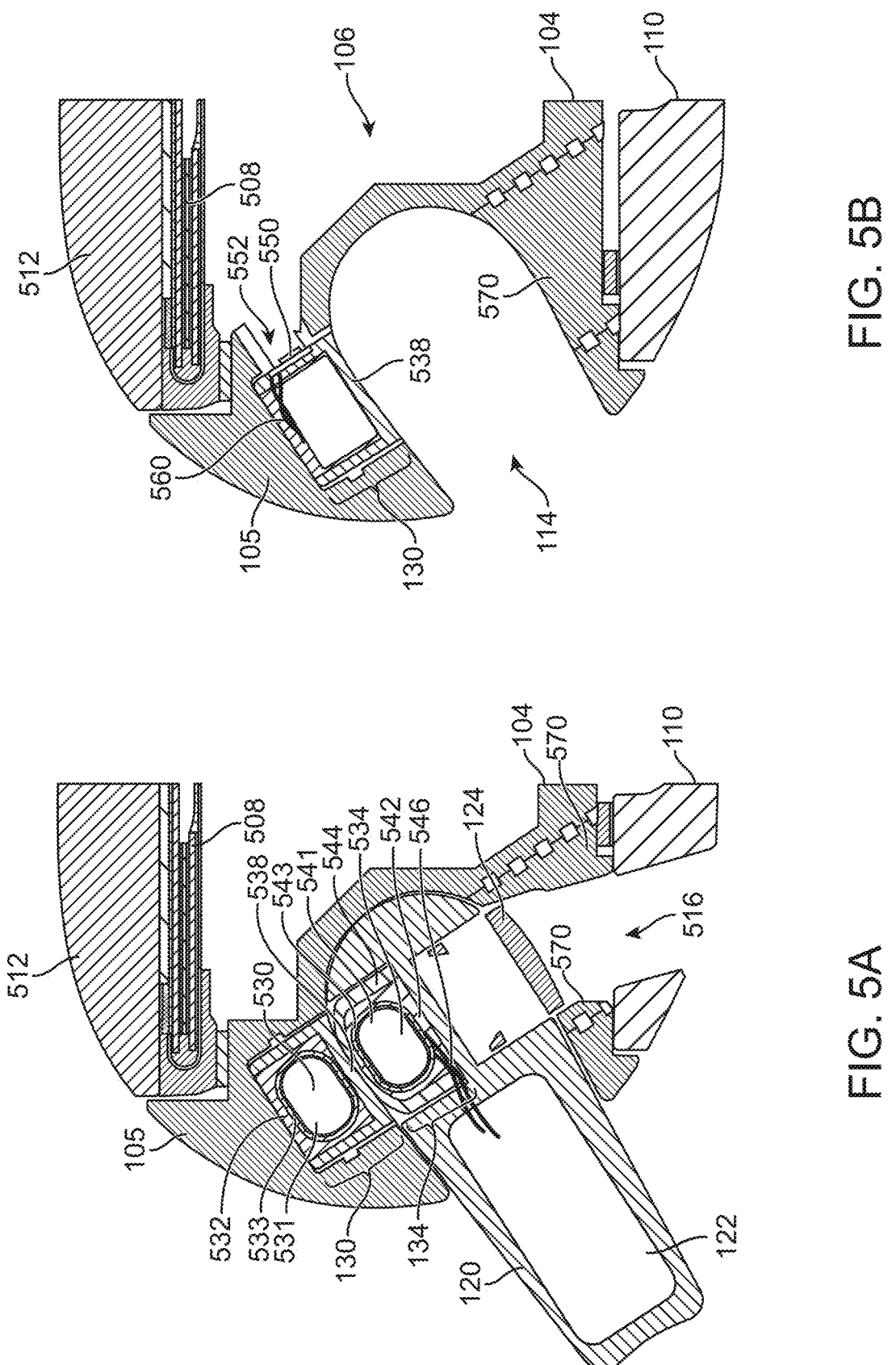
FIGS. 5A and 5B show simplified cross section views through lines A-A and B-B, respectively of FIG. 4 according to some embodiments.

FIGS. 5A and 5B show simplified cross section views through lines A-A and B-B, respectively, of FIG. 4 according to some embodiments. In FIG. 5A, band 120 is shown in an band slot 114; in FIG. 5B, band 120 is not shown. The cross-section in FIG. 5A shows an opening 516 that can extend through rear housing member 110 and end wall 105 to accommodate band release button 116 (which is not shown in FIG. 5A). FIG. 5B shows a different cross section, away from band release button 116, and opening 516 is absent.

In this example, housing 104 includes end wall 105 sealed to a front assembly 512. Front assembly 512 can include display 112 and electronic components 508, which may include or be coupled to main logic module 108 of FIG. 1. Inductive coil assembly 130 in this example includes an inductive bar 530, which can include an inductive coil 533 wrapped around a ferrite core 531 (similarly to inductive bar 200 described above); a protective cap 538 made of a magnetically permeable material; and potting material 532 filling a space between inductive bar 530 and protective cap 538. (It should be understood that other inductive coil structures, such as inductive coil structure 300, can be substituted for inductive bar 530.) Protective cap 538 can provide a smooth sidewall for band slot 114 and can also protect inductive bar 530 from the elements. Inductive coil assembly 130 can be inserted or embedded in end wall 105 such that the end caps of inductive bar 530 are oriented to direct magnetic flux into band slot 114. As shown in FIG. 5B, protective cap 538 can include one or more contact pads 550 that are exposed to main recess 106 via an opening 552. A wire end 560 of inductive coil 533 can be electrically coupled to contact pad 550, and contact pad 550 can be used to electrically couple coil 202 to power source (or power receiver) circuitry of main logic module 108 (the coupling is not shown in FIG. 5B). A water-resistant seal can be formed around inductive coil assembly 130 to prevent ingress of water into or through the area around contact pad 550.

As shown in FIG. 5A, band 120 can include an inductive coil assembly 134. Similarly to inductive coil assembly 130, inductive coil assembly 134 in this example includes an inductive bar 534, which can include a coil 543 of wire wrapped around a ferrite core 541 (similarly to inductive bar 200 described above); a protective cap 544 made of a magnetically permeable material; and potting material 542 filling a space between inductive bar 534 and protective cap 544. (It should be understood that other inductive coil structures, such as inductive coil structure 300, can be substituted for inductive bar 530.) Inductive coil assembly 134 can be inserted or embedded in the attachment portion of band 120. Protective cap 544 can have a smooth or low-friction outer surface to facilitate sliding of the attachment region of band 120 into (and out of) band slot 114 and can also protect inductive bar 534 (or other inductive coil structure) from the elements. In some embodiments, protective cap 544 and potting material 542 can provide a water-resistant seal to prevent ingress of water into the interior of band 120. Wire ends 546 of coil 543 of inductive coil assembly 134 can be electrically connected to circuitry 122 and can receive current from (or provide current to) coil 543. In some embodiments, inductive coil assembly 134 can occupy a portion (e.g., up to about half) of the thickness of band 120 in the attachment region, leaving space for retention features (e.g., retention tooth 124) in the other half. The allocation of space between inductive coil assembly 134 and retention feature may depend on the specific retention features.

In some embodiments, an opening can be formed through end wall 105 during manufacture to allow access to the region where inductive coil assembly 130 is to be installed. After installation of inductive coil assembly 130 and prior to attaching rear housing member 110, the opening can be filled with material 570. (The nature and use of material 570 will become apparent in view of the manufacturing process described below.)

FIGS. 6A and 6B show simplified front and rear views, respectively, of a band 600 according to some embodiments. Band 600 can be an implementation of band 120 described above. Band 600 can include an attachment region 602 at one end that can slide laterally into and out of band slot 114. As shown in FIG. 6A, a front surface of attachment region 602 can include protective cap 544 of inductive coil assembly 134. Protective cap 544 can be made of an electrically non-conductive (or insulating) material that is transparent to magnetic flux. In some embodiments, a soft material such as silicone or the like can be used. If desired, the material can have a low coefficient of friction to facilitate lateral sliding of band 600. Protective cap 544 may be visible when band 600 is detached, and the material and/or color of protective cap 544 can be chosen for a desired esthetic effect (e.g., to blend in or contrast with the band). Active electronic components (e.g., circuitry 122 described above) can be disposed within band 600 and electrically coupled to inductive bar 540 (which is covered by protective cap 544 in FIG. 6A).

As shown in FIG. 6B, a rear surface of attachment region 602 of band 600 can include retention feature 548, which can be a retention tooth described above. Retention feature 548 can be made of a rigid material and can be biased proud with a force that can be overcome by pressure so that retention feature 548 can retract into the body of band 600. Attachment region 602 can also include one or more bumpers 626 adjacent to retention feature 548. Bumpers 626 can be made of a material having a low coefficient of friction to facilitate lateral sliding of band 600 and can be flush or approximately flush with the surface of band 600. As with protective cap 544, bumpers 626 and retention feature 548 may be visible when band 600 is detached, and the material and/or color of bumpers 626 can be chosen for a desired esthetic effect (e.g., to blend in or contrast with the band).

In the embodiment shown, band 600 is formed as a strap section having holes 610. A second strap section (not shown) can have an attachment region similar or identical to attachment region 602 and pegs, clasps or the like that engage with holes 610 for securing the band to the user's wrist. Other implementations are possible, including bands with attachment regions 602 at both ends. An inductive coil assembly 134 can be provided in either or both attachment regions. More generally, an accessory can have any number of attachment regions, any or all of which can include an inductive coil assembly.

Referring again to FIGS. 5A and 5B, to facilitate sliding of band 120 into and out of band slot 114, it is desirable for protective cap 538 to have a surface that sits flush with and matches the surface contour of the side wall of band slot 114. Further, inserting inductive coil assembly 130 into a recess in the sidewall of band slot 114 can pose challenges for manufacturing, due in part to tight spaces and potentially awkward angles. Accordingly, some embodiments provide manufacturing processes that can be used to facilitate positioning of inductive coil assembly 130. For instance, inductive coil assembly 130 can fabricated as a blank that is inserted into end wall 105 prior to formation of band slot 114. An example of such a process will now be described.

Figure 7:
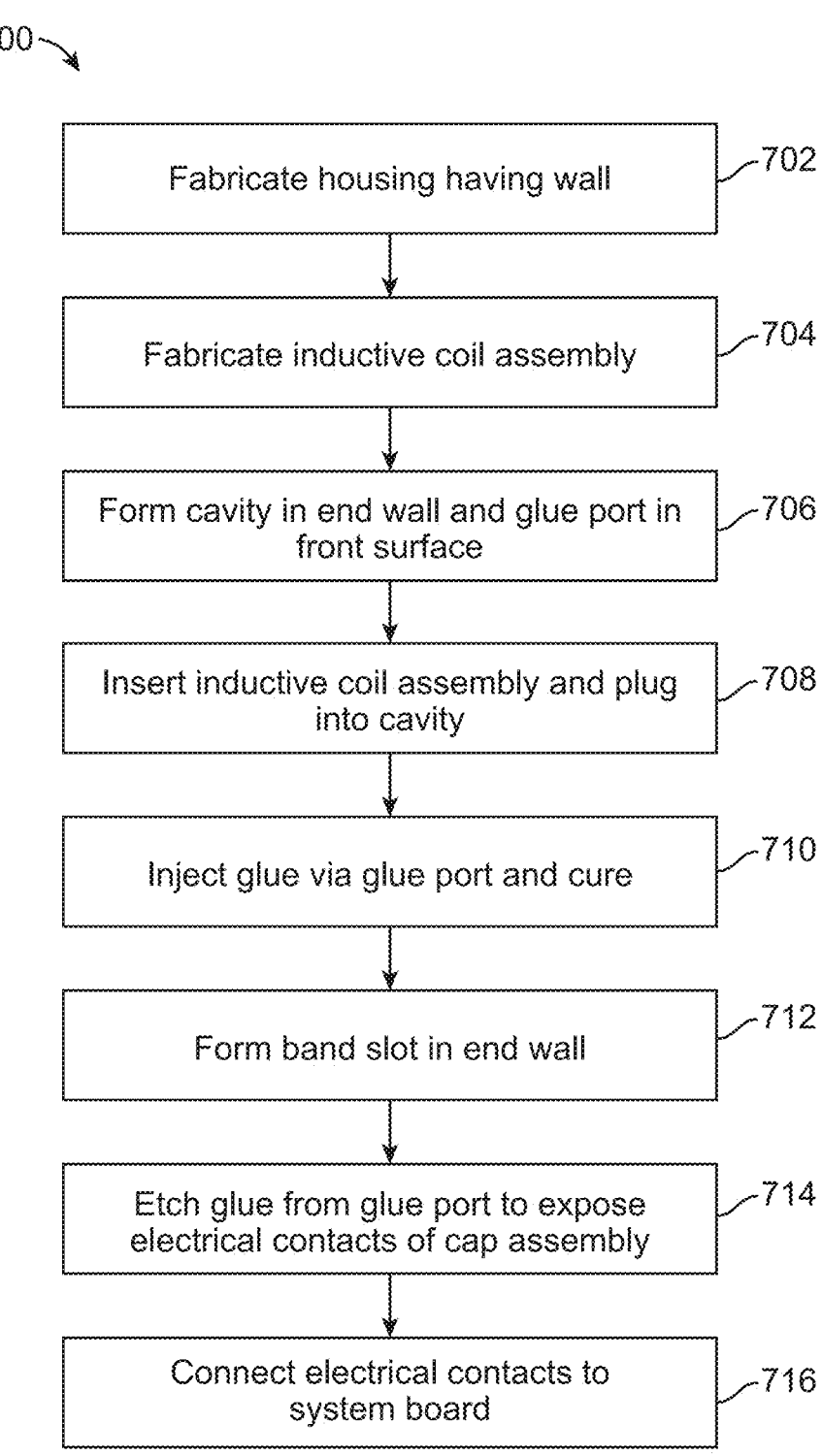
FIG. 7 shows a flow diagram of a manufacturing process according to some embodiments.

FIG. 7 shows a flow diagram of a manufacturing process 700 according to some embodiments. Process 700 can be used to manufacture a device, such as a watch, that has a band slot with an inductive coil assembly of the kind shown in FIGS. 1, 5A, and 5B.

At block 702, a housing blank for a device can be fabricated. The housing blank can be made of an appropriate material for the particular device; examples include aluminum, stainless steel, titanium, other metals or metal alloys, ceramics, plastics, and other materials. By way of example, FIG. 8 shows a simplified cross-section view of a portion of a housing blank 800 according to some embodiments. Housing blank 800 can be used to create housing 104 for main device 102 described above. In this example, housing blank 800 has an end wall region 802 where a band slot will be formed. End wall region 802 extends between a back surface 810 and a front surface 812 and can have a curved outer surface 814 (or other shape based on the desired esthetic appearance of the device). At this stage, end wall region 802 can be a solid mass of material, as shown, with an outer shape that generally matches the outer shape of the finished device.

Figure 9B:
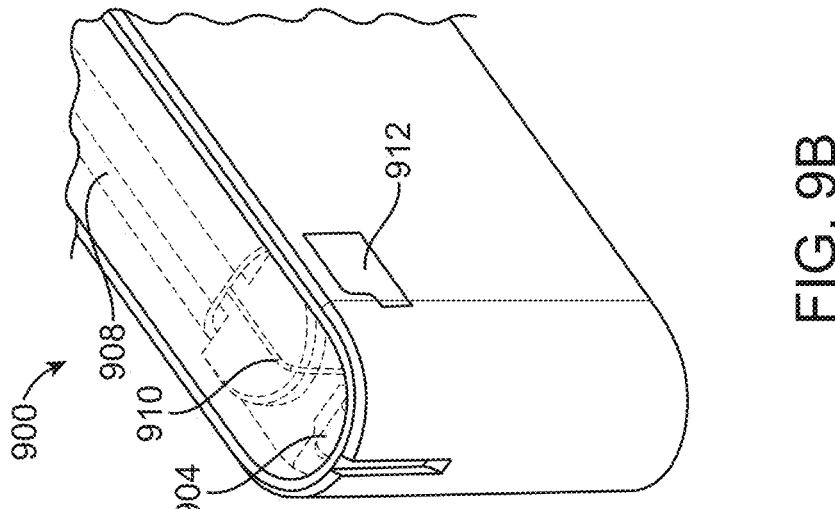
Figure 9A:
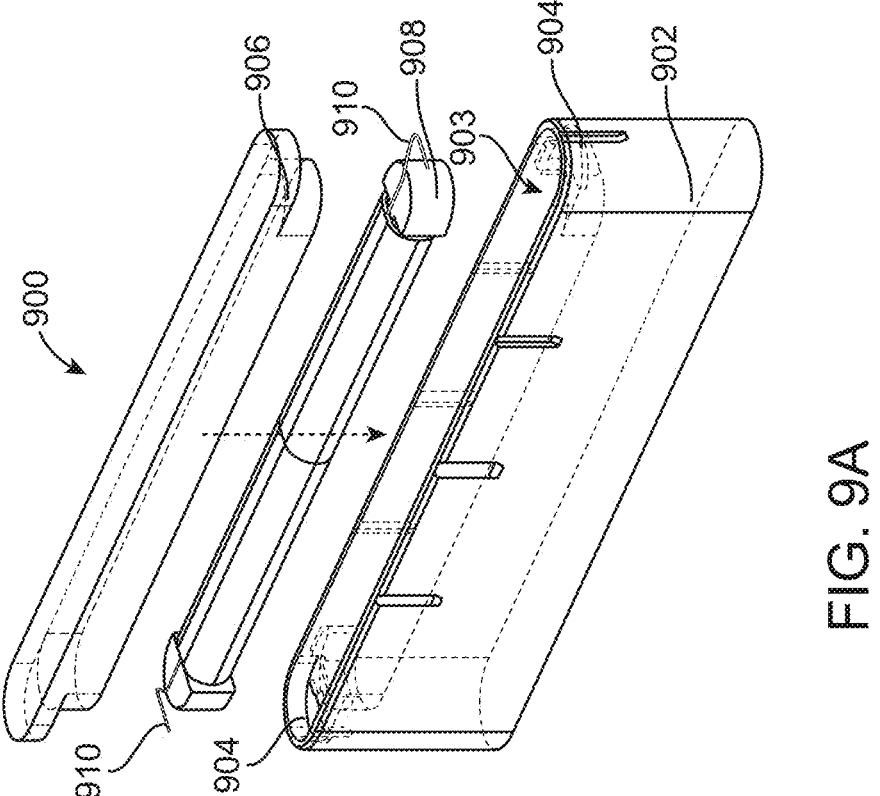

At block 704 an inductive coil assembly that incorporates an inductive bar can be fabricated. By way of example, FIG. 9A shows an exploded view of an inductive coil assembly 900 according to some embodiments, and FIG. 9B shows a partial perspective view of inductive coil assembly 900. Inductive coil assembly 900 can include a cap blank 902 and an inductive coil structure 908, which can be similar or identical to inductive bar 200 described above; other inductive coil structures (such as inductive coil structure 300 described above) can also be used. Cap blank 902 can be made of polymers, other plastics or any other material (or combination of materials) that provides a solid, electrically insulating and magnetically permeable structure. As will become apparent, a portion of cap blank 902 can form protective cap 538 shown in FIGS. 5A and 5B. Cap blank

902 can have an elongated shape with a slot 903 to receive inductive coil structure 908. The height (h) of cap blank 902 can be chosen as desired; examples are described below. Cap blank 902 can include coil contact pads 904 to which coil ends 910 of inductive coil structure 908 can be attached (e.g., using solder, wire-bonding, or other techniques to establish electrical connectivity between components). As best seen in FIG. 9B, coil contact pads 904 can be electrically connected to side contacts 912 that are exposed on a side surface of cap blank 902. In some embodiments, coil contact pads 904 and side contacts 912 can be formed using stamping techniques, and cap blank 902 can be fabricated using injection molding or similar techniques. Potting material 906 can be applied to encapsulate and hold inductive coil structure 908 in slot 903.

Figures 10A, 10B, 10C:
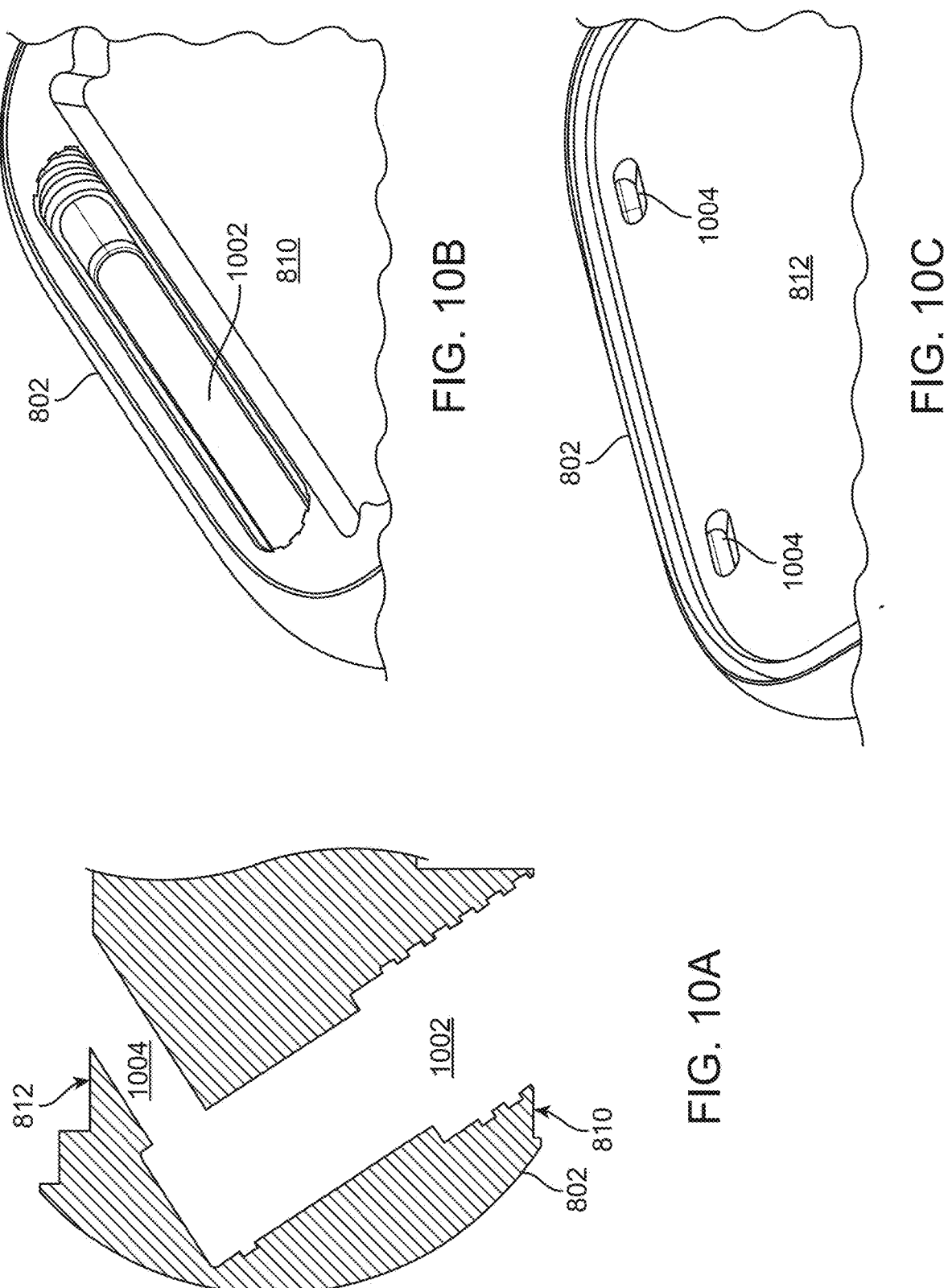

Referring again to FIG. 7, at block 706, the housing blank can be machined to create a cavity for receiving the inductive coil assembly and to create one or more glue ports. By way of example, FIGS. 10A-10C show simplified views of end wall region 802 of housing blank 800 after machining at block 708 according to some embodiments. FIG. 10A shows a cross-section view, FIG. 10B shows a perspective view of back surface 810, and FIG. 10C shows a perspective view of front surface 812. A cavity 1002 is formed in back surface 810, e.g., using precision machining tools and techniques. Cavity 1002 can be sized and shaped to accommodate inductive coil assembly 900. In the embodiment shown, cavity 1002 is formed at an angle that is approximately orthogonal to the eventual sidewall of the band slot (which has not yet been formed); however a particular angle is not critical. Cavity 1002 can have surface features (e.g., ridges and valleys as shown) to facilitate securing inductive coil assembly 900 (and other components) in place, as described below. Glue ports 1004 can be formed in front surface 812, e.g., using precision machining tools and techniques. Each glue port 1004 intersects with cavity 1002, forming open paths through end wall region 802 between back surface 810 and front surface 812. Glue ports 1004 can be smaller in cross-sectional area and length than cavity 1002. As will become apparent, glue ports 1004 can be positioned to align with side contacts 912 of inductive coil assembly 900 (when inductive coil assembly 900 is inserted into cavity 1002) and can provide a path for making electrical connections to side contacts 912. In the embodiment shown, two glue ports 1004 are provided, toward either lateral end of cavity 1002; however, any number of glue ports can be provided. Some or all of the glue ports can be aligned with side contacts of the inductive coil assembly to facilitate electrical connections (e.g., as described below).

Figure 12:
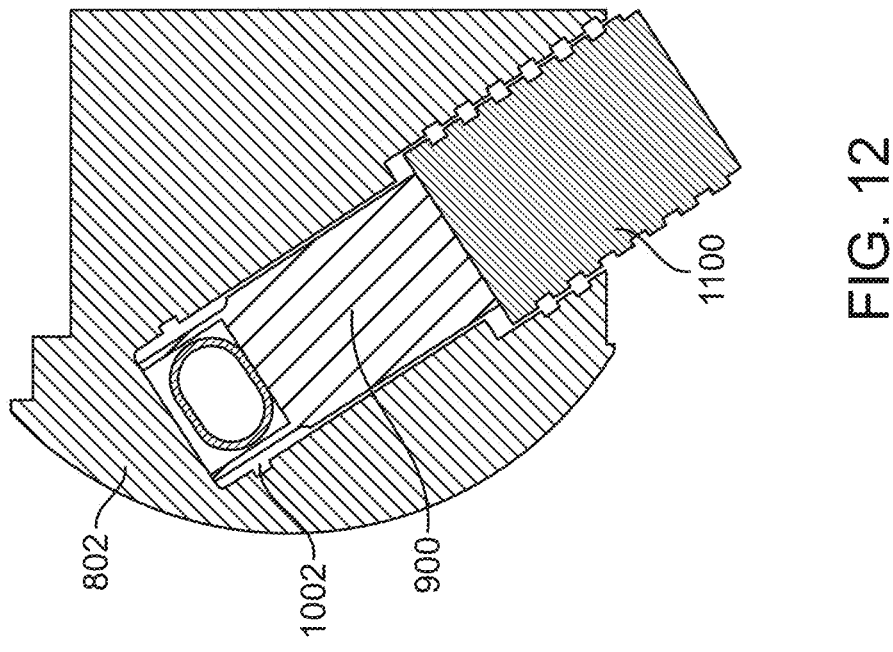
Figure 11:
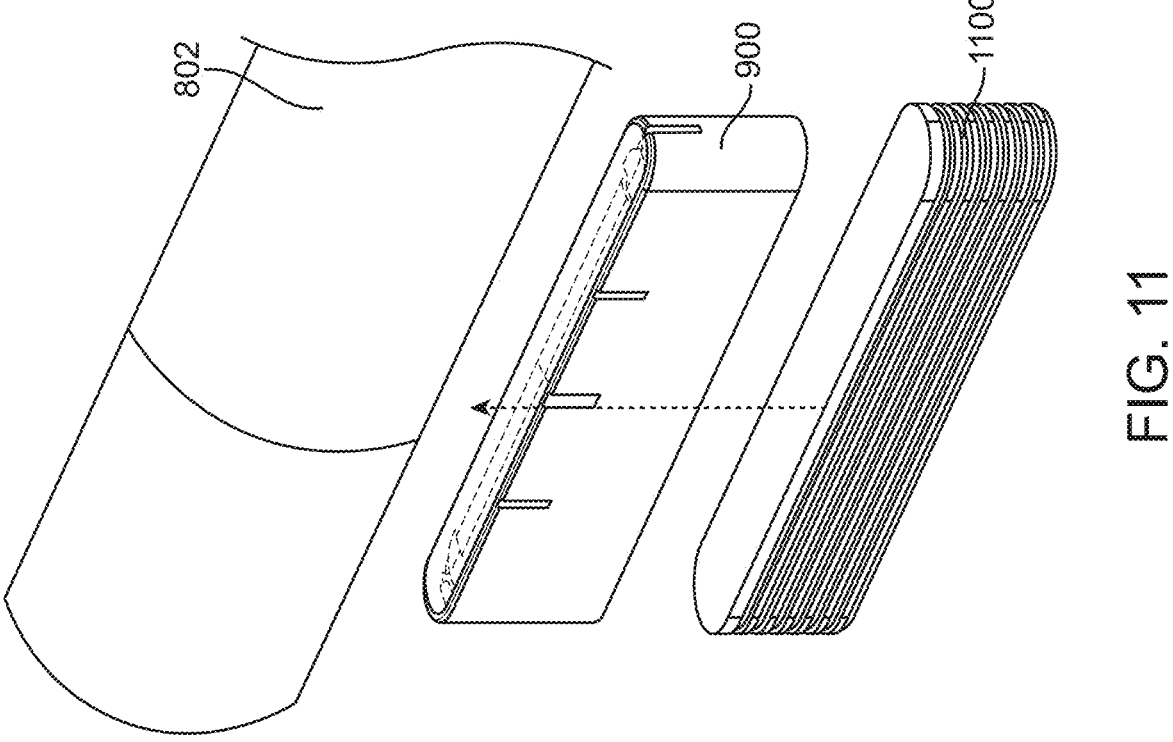

Referring again to FIG. 7, at block 708, the inductive coil assembly and a plug can be inserted into the cavity formed at block 706. By way of example, FIG. 11 shows a simplified perspective view of the insertion, and FIG. 12 shows a simplified cross-section view of the assembly after insertion. Inductive coil assembly 900 can be inserted into cavity 1002 with side contacts 912 oriented toward glue ports 1004. (In FIG. 11, side contacts 912 shown in FIG. 9 are on the far side of inductive coil assembly 900 and are not visible.) When inductive coil assembly 900 is fully inserted, side contacts 912 can be exposed via glue ports 1004. In the example shown, the height of inductive coil assembly 900 is less than the depth of cavity 1002. A plug 1100 can be inserted behind inductive coil assembly 900 to fill the remaining space. Plug 1100 can be shaped to fit into cavity 1002 and can have approximately the same elongated shape as inductive coil assembly 900. Plug 1100 can have surface features (e.g., ridges and valleys as shown) to facilitate securing in place, as describe below. A rear end of plug 1100 can be flush with or extend beyond the opening of cavity 1002.

Plug 1100 can be made of various materials, including the same material as end wall region 802 or a different material. In some embodiments, a portion of the material of plug 1100 may remain after manufacture (e.g., as material 570 in FIGS. 5A and 5B) and may form a portion of a visible surface, such as the rear face of the device. The material of plug 1100 may be selected in part for esthetic effect. For instance, forming plug 1100 from the same material as end wall 804 can provide low contrast so that plug 1100 is barely noticeable. Alternatively, a material with a different color or finish may be chosen to provide an intentional contrast effect. Such an effect may provide a visual indicator as to whether a particular device is interoperable with active bands or with active bands having particular functionality.

Figure 13B:
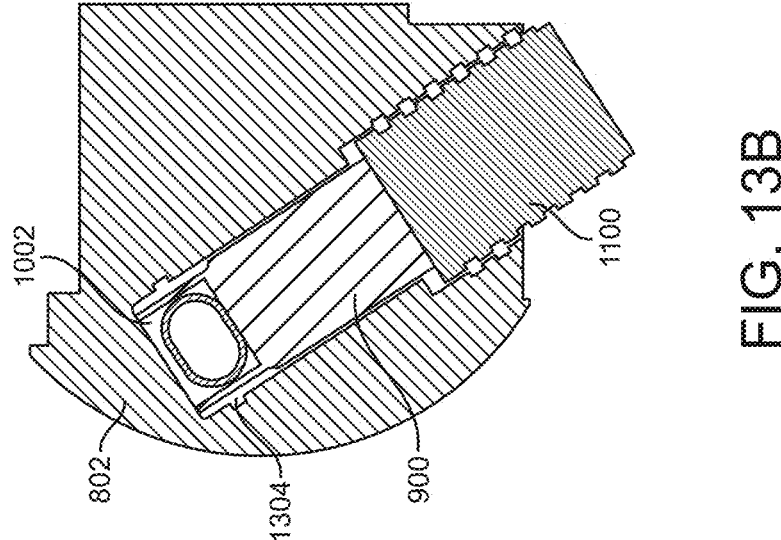
Figure 13A:
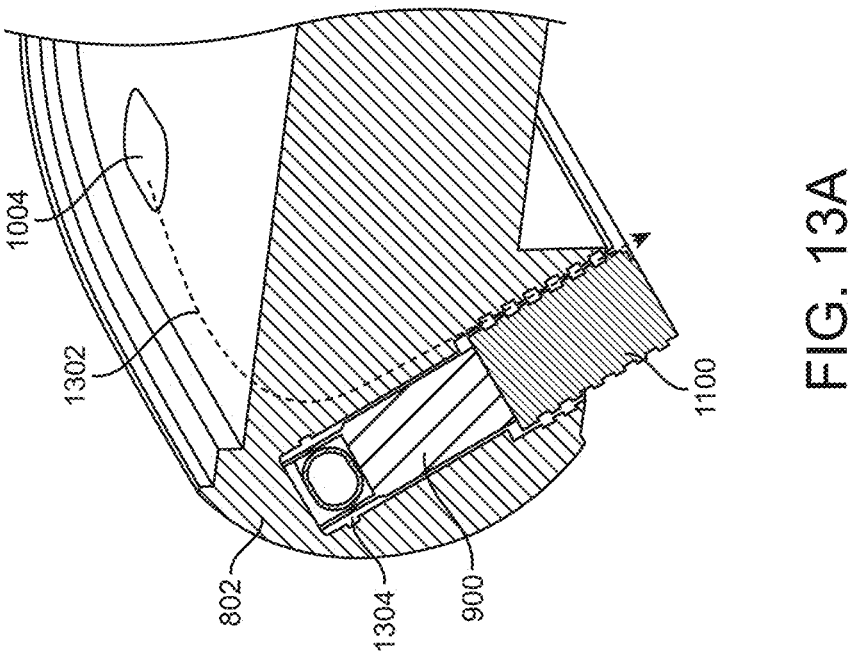

Referring again to FIG. 7, at block 710, glue can be injected via one or more of the glue ports to secure the inductive coil assembly and plug to the walls of the cavity. As used herein, "glue" refers generally to epoxy or other adhesive materials that can flow to surround the inductive coil assembly and plug, then be solidified (e.g., via a curing process) to provide a durable bond. In some embodiments, the glue bond can also provide a water-resistant seal around the inductive coil assembly and plug. The particular choice of glue can depend on the particular materials of the inductive coil assembly, plug, and end wall. By way of example, FIG. 13A shows a cutaway perspective view and FIG. 13B shows a simplified cross section view of glue injected via glue ports 1004 into cavity 1002. In FIG. 13, dotted arrow 1302 indicates a glue path from glue port 1004 into and through cavity 1002. Within cavity 1002, the glue can flow around inductive coil assembly 900 and plug 1100. Gaps created by ridges and valleys in plug 1100, cap blank 902, and the sidewall of cavity 1002 can increase bond strength by providing additional spaces for glue to fill. As shown in FIG. 13B, glue 1304 can fill any residual space in cavity 1002 so that inductive coil assembly 900 and plug 1100 are bonded into place. In some embodiments, the amount of glue injected is sufficient to fill all gaps and form a seal between the walls of cavity 1002 and the inserted inductive coil assembly 900 and plug 1100. Excess glue can flow out of cavity 1002 at back surface 810 and/or via glue ports 1004. Plug 1100 can be but need not be secured to inductive coil assembly 900, as long as each of inductive coil assembly 900 and plug 1100 is secured to the walls of cavity 1002. Tightness of fit of inductive coil assembly 900 and plug 1100 into cavity 1002, including surface features such as ridges and valleys, can be optimized so that the glue provides a strong bond and a water-resistant seal (to a desired degree of water-resistance).

Figure 14B:
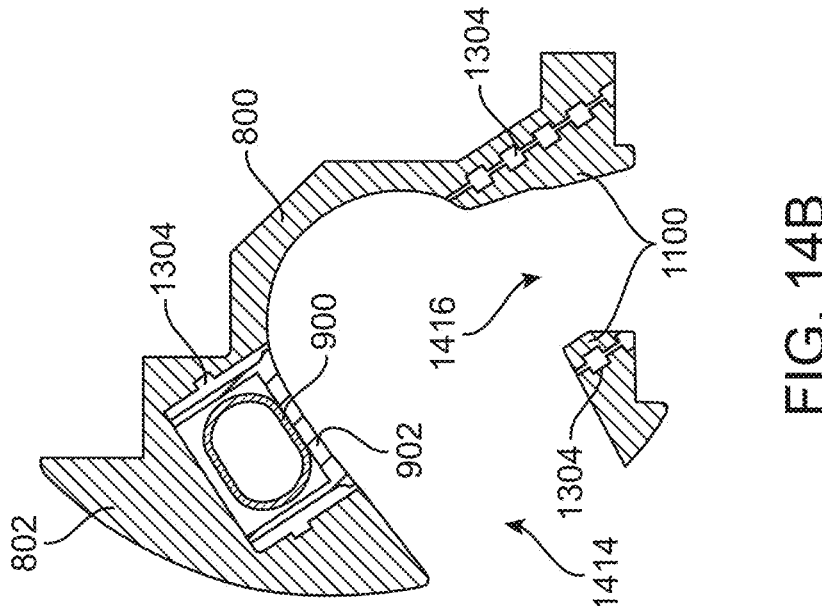
Figure 14A:
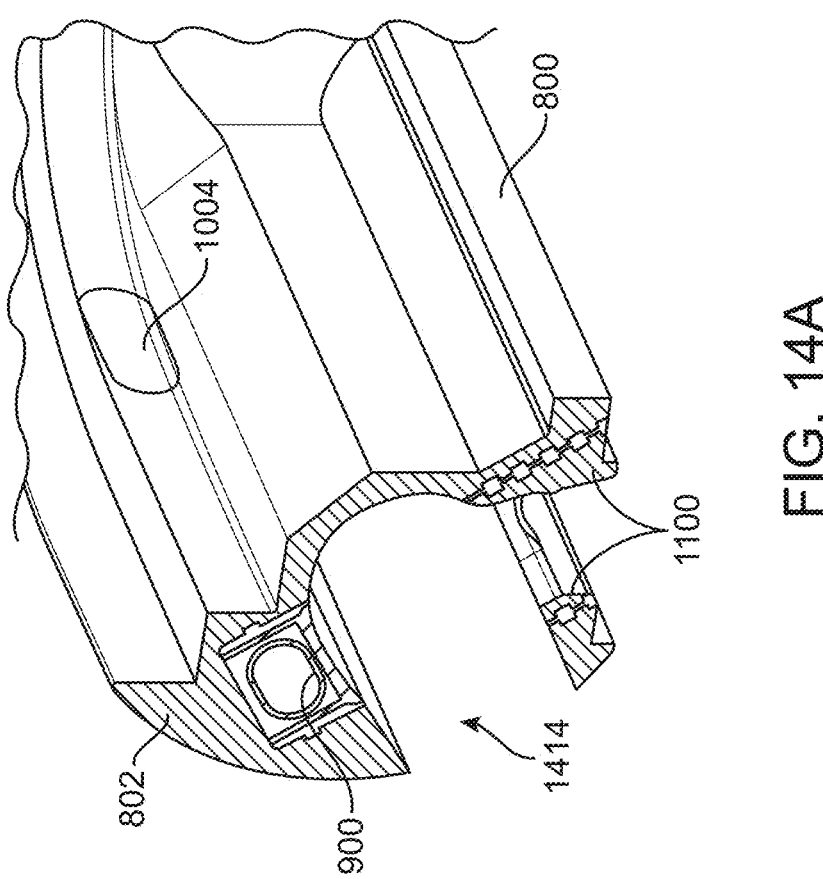

Referring again to FIG. 7, at block 712, after curing the glue, the end wall of the housing blank can be machined to form a band slot and an opening for a retention button (or other retention feature). In some embodiments, machining of other portions of the housing blank can also be performed at this stage, e.g., to create a central cavity, recesses or openings for displays, speakers and microphones, sensors of various types, and so on. Portions of the glue ports may also be machined away. By way of example, FIG. 14A shows a simplified cutaway perspective view of a portion of housing blank 800 after machining, and FIG. 14B shows a simplified side cross-section view. A band slot 1414 (corresponding to band slot 114) has been formed by a machining process that removed portions of cap blank 902 and plug 1100 as well as material from end wall region 802. A portion of the material of cap blank 902 remains, corresponding to protective cap

538 shown in FIGS. 5A and 5B. Glue 1304 holds the resulting cap in place and provides a water-resistant seal. In the opposite sidewall of band slot 114, a portion of plug 1100 remains, held in place by glue 1304. In the cross section shown, an opening 1416 for a band retention/release feature (e.g., band release button 116) has been machined through the material of plug 1100. As described above, opening 1416 can occupy a central portion of the band slot; in other cross-sections, plug 1100 can provide a portion of the sidewall of band slot 114.

The machining process at block 712 can provide a smooth, uniform surface for band slot 114, despite the presence of different materials. In addition, by inserting inductive coil assembly 900 through cavity 1002 prior to machining the band slot, assembly can be simplified as there is no need to machine a recess into the sidewall of the band slot or insert components into such a recess.

Figures 15, 16:
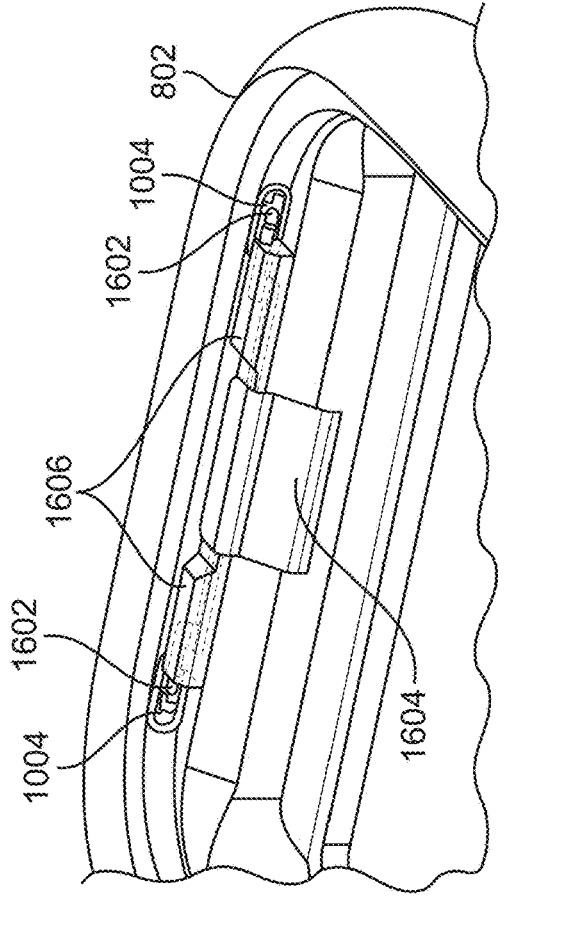

Referring again to FIG. 7, at block 714, glue can be etched away from the glue port(s) on the front surface of the housing to expose the electrical contacts of the inductive coil assembly, and at block 716, the exposed electrical contacts can be connected to a system board. By way of example, FIG. 15 shows a simplified perspective view showing one glue port 1004 from which glue 1304 has been etched away to expose side contact 912 of inductive coil assembly 900. FIG. 16 shows another simplified perspective view with an example of electrical connections to side contacts 912. In this example, a flexible printed circuit board (or "flex") 1604 has electrically conductive fingers 1602 that are electrically coupled to side contacts 912. Conductive fingers 1602 can be sheathed in electrically insulating material 1606. In some embodiments, conductive fingers 1602 can be spring-biased to press into the openings of glue ports 1004. In addition or instead, solder can be used to create a secure electrical connection. Although not shown in FIG. 16, the other end of flex 1604 can be connected to other electronic components (e.g., a main logic board) inside the main recess of housing 1000.

After block 716, assembly of the device can continue with other processes, such as installing a main logic board, sensors, display electronics, display glass, a rear cap, and a band release button or other band retention/release mechanisms.

Process 700 is illustrative, and variations and modifications are possible. Operations can be performed in a different order from that described, to the extent that logic permits; operations described above may be omitted or combined; operations described sequentially may be performed in parallel; and operations not expressly described may be added. Further, other processes can also be used to position an inductive bar along one sidewall of a band slot of a device.

While the invention has been described with reference to specific embodiments, those skilled in the art will appreciate that variations and modifications are possible. For instance, while a smart watch with a band containing active circuitry is used as an example, the particular size or form factor of the devices can be modified as desired. Inductive charging assemblies of the kind described herein can be implemented in any context where a first electronic device has a slot into which an attachment region of a second electronic device can be inserted and where it is desirable to transfer power between the first electronic device and the second electronic device. The terms "device" and "accessory" can be understood as distinguishing a device that has a slot from a device that has an attachment region insertable into the slot. In a device that has multiple accessory attachment slots, inductive charging assemblies of the kind described herein can be provided in any one or more of the accessory attachment slots. Similarly, in an accessory that has multiple attachment regions, inductive charging assemblies of the kind described herein can be provided in any one or more of the attachment regions. Further, an inductive charging assembly can be provided at one attachment region (e.g., one end of a band) while another attachment region includes retention features but not an inductive charging assembly. Where inductive charging assemblies are provided in both devices, power transfer can occur in either direction (from device to accessory or vice versa) or in both directions (at different times). The inductive bars described herein are also illustrative; the geometry and/or orientation of the inductive charging coils can be modified to optimally exploit available volume in a given implementation. Retention features can also be varied and can include one or more retractable teeth as described above; interlocks that can be engaged and released by sliding, rotating, or otherwise moving an external release mechanism; and other features. The insertion path can also be varied. For instance, instead of lateral sliding as described above, the attachment region of the accessory can be inserted into a slot using a longitudinal (plug-in) motion path, provided that insertion results in bringing the inductive coil assemblies of the accessory and the device into close enough proximity to allow wireless power transfer to occur.

Accessories such as active bands can implement a variety of features and operations, and different active bands can implement different features and operations. In some embodiments, a user can replace one accessory with another, e.g., to obtain different functionality at different times. An electronic device such as a smart watch having an accessory attachment slot with an inductive coil as described herein can also be compatible with "passive" accessories (e.g., passive watch bands or other device holders) that may use the attachment slot for mechanical purposes (e.g., securing a device to a user's person or to a device holder) but do not consume or provide power and need not contain any electronic components at all. Thus, the same device can be used with active or passive accessories at different times. In some embodiments, sensors or other circuitry in the device can determine whether an attached accessory has active circuitry and can control the inductive coil accordingly (e.g., inactivating the coil to conserve power when an active accessory is not present or reversing the direction of power transfer based on the particular active accessory that is present).

If desired, data communication between a device (e.g., main device 102 of FIG. 1) and an accessory (e.g., band 120) can also be provided. For example, data can be communicated by modulating the time-varying electromagnetic fields used for inductive power transfer. Other wireless communication techniques can be used, including Bluetooth, short-range RF communication (e.g., in the 60 GHz band), optical signaling, and so on. Any communication components and/or techniques that are compatible with inductive power transfer as described herein may be provided. Any type of data can be communicated, including, e.g., information about the capabilities of the device and/or the accessory, requests to start or stop transmission of power, parameters for inductive power transfer, sensor data from sensors in either the device or the accessory, and so on.

In various embodiments of the present invention, the components of the assemblies may be formed in various ways of various materials. For example, conductive portions and other metal features may be formed by stamping, metal-injection molding, machining, micro-machining, 3-D printing, or other manufacturing process. The conductive and other portions may be formed of stainless steel, steel, copper, copper titanium, phosphor bronze, palladium, palladium silver, or other material or combination of materials. They may be plated or coated with nickel, gold, or other material. Nonconductive components or portions of components may be formed using injection or other molding, 3-D printing, machining, or other manufacturing process. Nonconductive portions may be formed of silicon or silicone, Mylar, Mylar tape, rubber, hard rubber, plastic, nylon, elastomers, liquid-crystal polymers (LCPs), ceramics, or other nonconductive material or combination of materials. Cores for inductive bars may be formed of ferrite material, such as a soft ferrite, or other material that can direct magnetic flux in a desired pattern. The cores may be sintered or subjected to other manufacturing steps, e.g., prior to winding the coil. Coils for inductive bars may be formed using copper wire or other conductive wire, and wires can be single-stranded or multi-stranded as desired. Alternatively a printed coil on a flexible substrate can be used. Flexible circuit boards may be replaced with printed circuit boards (PCBs) or other appropriate substrates.

Embodiments of the present invention can be implemented in a variety of electronic devices as described above. Such devices may include wearable devices such as watches, bracelets, belts, rings, eyewear (e.g., eyeglasses or goggles), and any other wearable device. Accessory attachment slots of the kind described herein can also be provided in other types of electronic devices, such as tablet computers, desktop computers, laptops, all-in-one computers, cell phones, smart phones, media phones, storage devices, keyboards, covers, cases, portable media players, navigation systems, monitors, power supplies, adapters, remote control devices, chargers, and other devices. Accessories can have any form factor (e.g., bands, straps, covers, beads, tripods, figurines, etc.) and any functionality. Wireless power transfer can be implemented using protocols such as the Qi protocol for wireless charging. Power transferred wirelessly can be used to charge batteries or other power storage components and/or delivered immediately as operating power for the receiving device. In some embodiments, the time-varying magnetic fields can be used to communicate data (e.g., using modulation techniques) in addition to or instead of power.

Any numerical values and ranges provided herein are illustrative and may be modified. Unless otherwise indicated, drawings should be understood as schematic and not to scale.

Accordingly, although the invention has been described with respect to specific embodiments, it will be appreciated that the invention is intended to cover all modifications and equivalents within the scope of the following claims.

What is claimed is:

1. An electronic device comprising:
   a housing having a wall, the wall having a slot formed therein to receive at least a portion of an accessory, the slot having first and second opposing sidewalls that extend along a lateral direction;
   an inductive coil assembly positioned in a recess in the first sidewall, wherein the inductive coil assembly includes:
   a ferrite core; and
   a wire wrapped helically around at least a portion of the ferrite core; and
   a magnetically permeable cap that forms a portion of the first sidewall of the slot and that covers the ferrite core; and
   an active electronic component disposed within the housing and coupled to the inductive coil assembly.

2. The electronic device of claim 1 further comprising:

an accessory retention feature disposed in the second sidewall of the slot.

3. The electronic device of claim 2 wherein the accessory retention feature includes a release button that extends from the second sidewall to a rear surface of the housing.

4. The electronic device of claim 1 wherein the second sidewall of the slot has an opening extending through to a rear surface of the housing and wherein a plug is sealed into the opening.

5. The electronic device of claim 4 wherein the plug is made of same material as the wall.

6. The electronic device of claim 1 further comprising an accessory having an attachment region insertable into the slot such that a first side surface of the attachment region is oriented toward the first sidewall of the slot and a second side surface of the attachment region is oriented toward the second sidewall of the slot, wherein:

the accessory includes an inductive coil assembly positioned in the attachment region and oriented toward the first side surface; and the accessory further includes a retention feature positioned in the attachment region and oriented toward the second side surface.

7. The electronic device of claim 6 wherein the accessory is a band usable to secure the electronic device to a wrist of a user.

8. An accessory for an electronic device, the accessory including:

a body having an attachment region insertable into a slot of an electronic device, the attachment region having a first side surface and a second side surface opposite the first side surface;

an inductive coil assembly positioned in the attachment region and oriented toward the first side surface, the inductive coil assembly including:

a ferrite core;

a coil of wire wrapped helically around at least a portion of the ferrite core; and a protective cap made of a magnetically permeable material that forms a portion of the first side surface and that covers the ferrite core; and a retention feature positioned in the attachment region and oriented toward the second side surface.

9. The accessory of claim 8 further comprising:

an active electronic component disposed within the body and coupled to the inductive coil assembly.

10. The accessory of claim 9 wherein the active electronic component is configured to operate the inductive coil assembly to receive power wirelessly from the electronic device.

11. The accessory of claim 9 wherein the active electronic component is configured to operate the inductive coil assembly to transmit power wirelessly to the electronic device.

12. An electronic device comprising:

a housing having a wall, the wall having a slot formed therein to receive at least a portion of an accessory, the slot having first and second opposing sidewalls that extend along a lateral direction;

an inductive coil assembly positioned in a recess in the first sidewall; and an active electronic component disposed within the housing and coupled to the inductive coil assembly, wherein the second sidewall of the slot has an opening extending through to a rear surface of the housing and wherein a plug is sealed into the opening.

13. The electronic device of claim 12 further comprising:

an accessory retention feature disposed in the second sidewall of the slot.

14. The electronic device of claim 13 wherein the accessory retention feature includes a release button that extends from the second sidewall to a rear surface of the housing.

15. The electronic device of claim 12 wherein the plug is made of same material as the wall.

16. The electronic device of claim 12 further comprising an accessory having an attachment region insertable into the slot such that a first side surface of the attachment region is oriented toward the first sidewall of the slot and a second side surface of the attachment region is oriented toward the second sidewall of the slot, wherein:

the accessory includes an inductive coil assembly positioned in the attachment region and oriented toward the first side surface; and the accessory further includes a retention feature positioned in the attachment region and oriented toward the second side surface.

17. The electronic device of claim 16 wherein the accessory is a band usable to secure the electronic device to a wrist of a user.

\* \* \* \* \*